United States Patent
Hoffman et al.

[11] Patent Number: 6,151,076
[45] Date of Patent: Nov. 21, 2000

[54] SYSTEM FOR PHASE-LOCKING A CLOCK TO A DIGITAL AUDIO SIGNAL EMBEDDED IN A DIGITAL VIDEO SIGNAL

[75] Inventors: Gilbert A. Hoffman, Aloha; Scott Zink, Portland, both of Oreg.

[73] Assignee: Tektronix, Inc., Beaverton, Oreg.

[21] Appl. No.: 09/021,699

[22] Filed: Feb. 10, 1998

[51] Int. Cl.[7] ............................... H04N 5/12; H04N 5/05; H04N 7/12
[52] U.S. Cl. .................... 348/512; 348/515; 348/537; 348/536; 348/423; 375/376; 375/362; 331/40; 331/41; 360/30; 360/51
[58] Field of Search ................................ 348/512, 513, 348/515, 423, 462, 536, 540, 544; 360/51, 64, 30; 331/17, 40, 41, 44, 175; 375/2, 376, 362

[56] References Cited

U.S. PATENT DOCUMENTS

| | | | |
|---|---|---|---|
| 5,111,346 | 5/1992 | Matsuoka | 360/64 |
| 5,162,746 | 11/1992 | Ghoshal. | |
| 5,276,712 | 1/1994 | Pearson. | |
| 5,416,527 | 5/1995 | Casey | 348/537 |
| 5,446,411 | 8/1995 | Horsfall et al. | 329/325 |
| 5,473,385 | 12/1995 | Leske | 348/845.3 |
| 5,506,627 | 4/1996 | Ciardi | 348/515 |
| 5,519,444 | 5/1996 | Ko et al. | 348/515 |
| 5,602,882 | 2/1997 | Co et al.. | |
| 5,703,537 | 12/1997 | Bland et al.. | |
| 5,828,414 | 10/1998 | Perkins | 348/423 |
| 5,926,515 | 7/1999 | Park | 331/25 |
| 5,929,921 | 7/1999 | Taniguchi et al. | 348/484 |
| 5,933,058 | 8/1999 | Pinto | 331/17 |

FOREIGN PATENT DOCUMENTS 0 395 347   4/1990   European Pat. Off..

*Primary Examiner*—Mark R. Powell
*Assistant Examiner*—Wesner Sajous
*Attorney, Agent, or Firm*—Francis I. Gray

[57] ABSTRACT

A system for phase-locking a clock to a digital audio signal embedded within a digital video signal uses an audio extractor, frequency dividers, and an adjusted bandwidth loop filter to prevent phase jitter associated with the digital audio signal preventing the functionality of the phase-lock loop or having unacceptable effects on the generated audio sample frequency signal. Extracted audio samples are divided down and input to a phase detector. The signal is then filtered using a series of loop filters, one of which has an adjusted bandwidth to reject phase jitter. A clock then outputs the generated synthesized audio sample frequency using the output from the series of loop filters, and the synthesized frequency signal is looped back through a second frequency divider to the phase detector.

14 Claims, 1 Drawing Sheet

N=DIVISOR FOR VIDEO SIGNAL
M=DIVISOR FOR EMBEDDED AUDIO SIGNAL

Y=DIVISOR VALUE OF FREQUENCY DIVIDER
Z=FREQUENCY OF EXTRACTED AUDIO SAMPLES

M=DIVISOR FOR EMBEDDED AUDIO SIGNAL 6,151,076

SYSTEM FOR PHASE-LOCKING A CLOCK TO A DIGITAL AUDIO SIGNAL EMBEDDED IN A DIGITAL VIDEO SIGNAL

BACKGROUND OF THE INVENTION

The present invention relates in general to digital video and audio, and more particularly to phase-locking a clock to a digital audio signal embedded within a digital video signal.

Audio data embedded within a digital video stream has a different integer frequency relationship to the video clock. For this reason, a conventional phase-locked loop locked to the video clock requires dividers for both the video clock signal and the synthesized audio clock signal as shown in FIG. 1. Depending upon the type of video signal, the audio signal's integer frequency relationship with the video clock may be relatively large. Conventionally, with some video signals, such as the National Television System Committee (NTSC) standard, the divider ratios become very large and impracticable to implement.

In the case of 14.31818 MHz NTSC D2 video, the integer ratio between the video clock and the 48 KHz audio clock is 4777500/16016. A conventional phase-locked loop that derives the 48 KHz audio signal in this case requires two dividers as shown in FIG. 1. One divides the video clock by 4777500, denoted by N in FIG. 1, and another which divides the audio clock by 16016, which is denoted by M FIG. 1. Also, in this case an additional problem is that the divided down frequency into the phase detector would be 2.997003 Hz, which requires a very slow loop filter.

Furthermore, accommodating a conventional multi-standard decoder requires switching divider ratios for each different video standard. For example, the divider ratio (M/N) described above for the NTSC D2 standard would change for both the Phase Alternate Line D2 (PAL D2) and 27 MHz D1 standards, which requires rather complex circuitry.

To avoid the above problems, another method to phase-lock a clock to an embedded digital audio signal is to detect each audio sample as it appears on the video and use that sample as an input to the phase detector of a phase-lock loop. This method is independent of the video standard, and works with a non-synchronous audio signal as well as with one synchronous to a video signal. However, significant problems with the above method exist. It happens that the audio data signal is "bursty" in that it has a great deal of phase jitter because the audio samples are dispersed very unevenly through the video signal. The phase jitter on the audio samples can be transferred to the regenerated audio clock created by the phase-lock loop and at times cause the phase detector to lose or gain cycles and not to function.

What is desired is a system for phase-locking a clock to a digital audio signal embedded within a digital video signal where phase jitter associated with the digital audio signal does not prevent the functionality of the phase-lock loop or have unacceptable effects on the generated audio clock signal.

SUMMARY OF THE INVENTION

In accordance with the illustrated preferred embodiment of the invention, a method and apparatus is disclosed to phase-lock a clock to a digital audio signal embedded within a digital video signal.

Audio samples are extracted from a digital video signal and are input to a frequency divider so that phase jitter present in the audio signal can be managed. The resultant signal is then processed by a phase detector, a first low pass input filter, and then a second loop filter in series with the first and configured in such a way to reject phase jitter. The output of the second loop filter is input to a voltage controlled oscillator (VCO) which includes its own frequency divider to divide down the clock signal to the original audio sampling frequency. The output of the VCO is then the resultant phased-locked audio sample frequency signal. This signal is input to a second frequency divider with the same divisor value as the frequency divider used to divide down the original input audio sample, before being looped back and input to the phase detector.

The objects, advantages, and other novel features of the present invention are apparent from the following detailed description when read in conjunction with the appended claims and attached drawing.

DESCRIPTION OF THE PREFERRED EMBODIMENT

Figure 2:
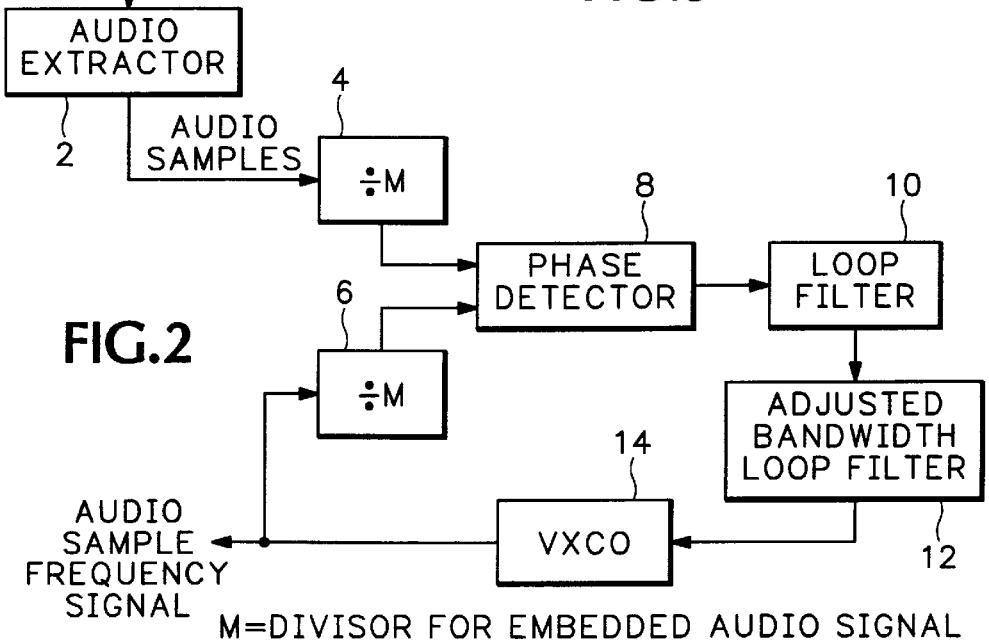
FIG. 2 is a block diagrammatic view of a system for phase-locking a clock to a digital audio signal embedded in a digital video signal according to the present invention.

Referring now to FIG. 2, a video signal is input to an audio extractor 2, the output audio samples from the audio extractor 2 are input to a first frequency divider 4. The divisor value of the first frequency divider 4 is that which will divide the frequency of the audio signal down enough so that the period is greater or equal to that of phase jitter present in the audio sample. This reduces phase jitter enough for a phase detector 8 to function. For example, if there is 1.0 ms of phase jitter present in an original 48 KHz extracted audio signal, the period of the original 48 KHz extracted audio signal will be smaller than the 1 ms of jitter. However, if the divisor of the frequency divider is 64, then the original 48 KHz extracted audio signal will be divided down to a 750 Hz signal, with a period larger than the phase shift caused by the 1 ms phase jitter.

The resultant signal from the first frequency divider 4 is then input to the phase detector 8. The output from the phase detector 8 is input to a first standard loop filter 10. The output of the loop filter 10 is then input to a second loop filter 12 with adjusted bandwidth in order to reject phase jitter. For example, the adjusted bandwidth second loop filter 12 may be a 10 Hz four-pole filter according to one preferred embodiment, which is sufficient to reject 50 Hz jitter, which is characteristic for embedded audio signals, but also may be configured to a degree that is sufficient to attenuate the phase jitter present in any specific original audio sample. However, the same effect is obtained by using a single loop filter. The single loop filter must be one that allows for a system gain to gradually decline to less than 1 with a phase shift not supporting oscillations at a gain of 1. The jitter frequency is higher than the crossover frequency at which the gain equals 1. Therefore, the single filter must have a bandwidth configured to a degree that is sufficient to attenuate the phase jitter present in the specific original audio sample.

The output of the second adjusted bandwidth loop filter 12 is then input to a voltage controlled oscillator (VCO) 14.

Figure 1:
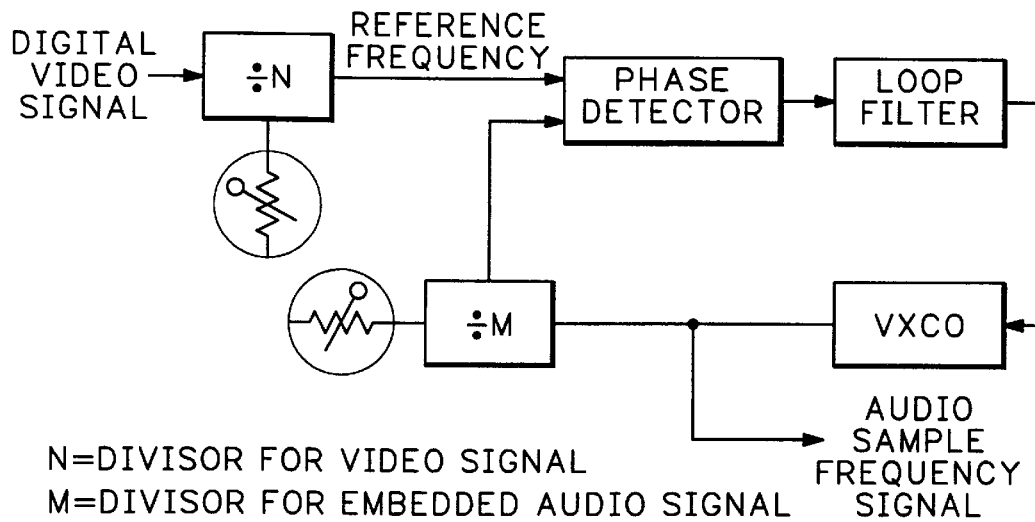
FIG. 1 is a block diagrammatic view of a prior art system for phase locking a clock to an audio signal embedded in a digital video signal.
Figure 3:
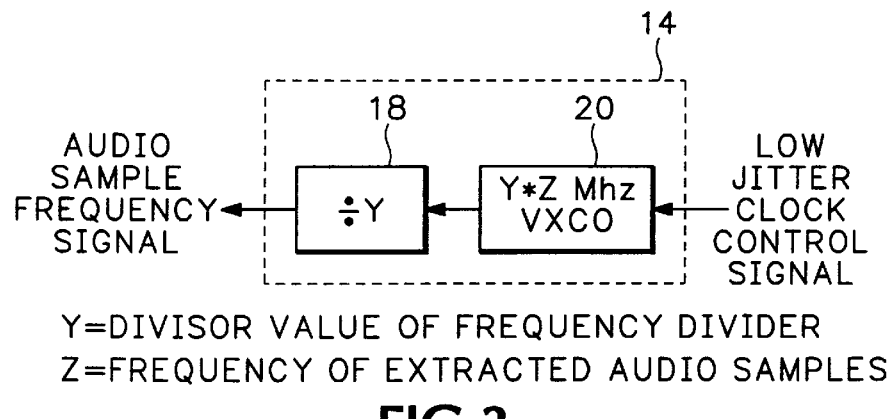
FIG. 3 is a block diagrammatic view of a voltage controlled oscillator (VCO) containing a frequency divider, according to the present invention.

Referring to FIG. 3, the VCO 14 contains an extra frequency divider 18, to divide down the output clock signal in this case to match the frequency of the embedded audio sample. Referring now to FIG. 2 again, the output from the VCO 14 is the synthesized audio sample frequency signal output with reduced phase jitter. The audio sample frequency signal is also input to a second frequency divider 6 with the same divisor as the first frequency divider 4. The divisors of the two frequency dividers 4, 6 are the same because the audio signal is extracted from the video signal and there is no need for a different divisor for phase-locking to the video signal clock.

The divided down audio sample frequency output from the second frequency divider 6 is then looped back and input to the phase detector 8 for comparison with the reference signal output from the first frequency divider 4.

Thus, the present invention provides a system for phase-locking a clock to a digital audio signal embedded within a digital video signal where phase jitter associated with the digital audio signal does not prevent the functionality of the phase-locked loop or have unacceptable effects on the generated audio clock signal.

What is claimed is:

1. A method for phase-locking a clock to a digital audio signal embedded within a digital video signal comprising the steps of:

generating a first reference frequency signal from digital audio signal samples embedded within the digital video signal by dividing the frequency of the digital audio signal samples by a divisor such that the period of the first reference frequency is greater or equal to that of phase jitter present in the digital audio signal samples;

generating a second reference frequency signal from an output audio sample frequency signal, the frequency of the output audio sample frequency signal being equal to the frequency of the digital audio signal samples so that, when divided by the divisor, the frequency of the second reference frequency signal equals that of the first reference frequency signal;

generating from the first and second reference frequency signals a low jitter clock control signal, the low jitter clock control signal been result of rejecting the phase jitter present in the digital audio signal samples; and generating the output audio sample frequency signal from the low jitter clock control signal.

2. The method according to claim 1, wherein the low jitter clock control signal generating step comprises the steps of:

inputting the first and second reference frequency signals into a phase detector; and filtering output from the phase detector such that the phase jitter present in the digital audio signal samples is rejected and the low jitter clock control signal is produced.

3. The method according to claim 2, wherein the filtering step comprises the step of inputting output from the phase detector through a series of two loop filters, one of which is an adjusted bandwidth loop filter, such loop filter's bandwidth configured to a degree which is sufficient to attenuate the phase jitter that is present in the digital audio signal samples, such that the low jitter clock control signal is produced.

4. The method according to claim 2, wherein the filtering step comprises the step of inputting output from the phase detector to a loop filter, such loop filter allowing for a system gain to decline to less than 1 with a phase shift not supporting oscillations at a gain of 1, and such loop filter's bandwidth is configured to a degree which is sufficient to attenuate the phase jitter that is present in the digital audio signal samples, such that the low jitter clock control signal is produced.

5. The method according to claim 1, wherein the output audio sample frequency signal generating step comprises the steps of:

inputting the low jitter clock control signal to a VCO;

dividing down an initial output of the VCO to the frequency of the digital audio signal samples; and outputting the divided down signal as the output audio sample frequency signal.

6. An apparatus for phase-locking a clock to a digital audio signal embedded within a digital video signal comprising:

means for generating a first reference frequency signal from digital audio signal samples embedded within the digital video signal by dividing the frequency of the digital audio signal samples by a divisor such that the period of the first reference frequency is greater or equal to that of phase jitter present in the digital audio signal samples;

means for generating a second reference frequency signal from an output audio sample frequency signal, the frequency of the output audio sample frequency signal being equal to the frequency of the digital audio signal samples so that, when divided by the divisor, the frequency of the second reference frequency signal equals that of the first reference frequency signal;

means for generating from the first and second reference frequency signals a low jitter clock control signal, the low jitter clock control signal been result of rejecting the phase jitter present in the digital audio signal samples; and means for generating the output audio sample frequency signal from the low jitter clock control signal.

7. The apparatus of claim 6, wherein the low jitter clock control signal generating means comprises:

means for inputting the first and second reference frequency signals into a phase detector; and means for filtering output from the phase detector such that the phase jitter present in the digital audio signal samples is rejected and the low jitter clock control signal is produced.

8. The apparatus of claim 7, wherein the filtering means comprises means for inputting output from the phase detector through a series of two loop filters, one of which is an adjusted bandwidth loop filter, such loop filter's bandwidth configured to a degree which is sufficient to attenuate the phase jitter that is present in the digital audio signal samples, such that the low jitter clock control signal is produced.

9. The apparatus of claim 7, wherein the filtering means comprise means for inputting output from the phase detector to a loop filter, such loop filter allowing for a system gain to decline to less than 1 with a phase shift not supporting oscillations at a gain of 1, and such loop filter's bandwidth is configured to a degree which is sufficient to attenuate the phase jitter that is present in the digital audio signal samples, such that the low jitter clock control signal is produced.

10. The apparatus of claim 6, wherein the output audio sample frequency signal generating means comprises:

means for inputting the low jitter clock control signal to a VCO; and means for dividing down an initial output of the VCO to the frequency of the digital audio signal samples; and means for outputting the divided down signal as the output audio sample frequency signal.

11. A system for phase-locking a clock to a digital audio signal embedded within a digital video signal comprising:
- an audio extractor, operative for extracting digital audio signal samples from the digital video signal;
- a first frequency divider coupled to receive the digital audio signal samples from the audio extractor, operative for dividing down the frequency of the digital audio signal samples, having a divisor such that the divided down signal has a period greater or equal to that of phase jitter present in the digital audio signal samples;
- a phase detector coupled to receive the divided down signal from the first frequency divider;
- a loop filtering apparatus coupled to receive output from the phase detector, such that the phase jitter present in the digital audio signal samples is rejected and a low jitter clock control signal is produced;
- a VCO coupled to receive the low jitter clock control signal from the loop filter apparatus; and
- a second frequency divider with input coupled to output from the VCO and output coupled for input to the phase detector, such frequency divider having a divisor equal to that of the first frequency divider.

12. The system according to claim 11, wherein the loop filtering apparatus comprises:
- a first loop filter coupled to receive output from the phase detector; and
- a second loop filter coupled to receive output from the first loop filter, one of which is an adjusted bandwidth loop filter, such loop filter's bandwidth configured to a degree which is sufficient to attenuate the phase jitter that is present in the digital audio signal samples, such that the low jitter clock control signal is produced.

13. The system according to claim 11, wherein the loop filtering apparatus comprises a loop filter coupled to receive output from the phase detector, such loop filter allowing for a system gain to decline to less than 1 with a phase shift not supporting oscillations at a gain of 1, and the loop filter's bandwidth is configured to a degree which is sufficient to attenuate the phase jitter that is present in the digital audio signal samples, such that the low jitter clock control signal is produced.

14. The system according to claim 11, wherein the VCO comprises:
- means for generating a clock signal from the low jitter clock control signal; and
- a frequency divider coupled to receive output from the clock signal generating means, such frequency divider having a divisor that divides the clock signal down to the frequency of the digital audio signal samples.

* * * * *